United States Patent
Liu et al.

(10) Patent No.: US 10,381,973 B2
(45) Date of Patent: Aug. 13, 2019

(54) UNIFORMLY AND DIRECTIONALLY COLORED PHOTOVOLTAIC MODULES

(71) Applicant: TESLA, INC., Palo Alto, CA (US)

(72) Inventors: John Liu, Fremont, CA (US); Ollivier J. Lefevre, Pleasanton, CA (US)

(73) Assignee: TESLA, INC., Palo Alto, CA (US)

( * ) Notice: Subject to any disclaimer, the term of this patent is extended or adjusted under 35 U.S.C. 154(b) by 0 days.

(21) Appl. No.: 15/598,194

(22) Filed: May 17, 2017

(65) Prior Publication Data

US 2018/0337629 A1    Nov. 22, 2018

(51) Int. Cl.
*H01L 31/02* (2006.01)
*H02S 20/25* (2014.01)
(Continued)

(52) U.S. Cl.
CPC .............. *H02S 20/25* (2014.12); *H01L 31/02* (2013.01); *H01L 31/02167* (2013.01);
(Continued)

(58) Field of Classification Search
CPC .............. H01L 31/048; H01L 31/0481; H01L 31/0488; H01L 31/0236; H01L 31/02366; H01L 31/02167; H01L 31/02168; Y02E 10/50; H02S 20/25; H02S 40/20; H02S 40/22

See application file for complete search history.

(56) References Cited

U.S. PATENT DOCUMENTS

| 3,369,939 A | 2/1968 | Myer |
| 3,461,602 A | 8/1969 | Hasel |

(Continued)

FOREIGN PATENT DOCUMENTS

| CN | 102544380 | 8/2015 |
| CN | 103426957 | 3/2016 |

(Continued)

OTHER PUBLICATIONS

Bulucani et al., "A new approach: low cost masking material and efficient copper metallization for higher efficiency silicon solar cells" 2015 IEEE.
(Continued)

*Primary Examiner* — Lindsey A Bernier
(74) *Attorney, Agent, or Firm* — Shun Yao; Park, Vaughan, Fleming & Dowler LLP

(57) ABSTRACT

Micro-structures and directional and multi-directional coatings for uniformly colored and directionally colored photovoltaic modules and roof tiles are described. The photovoltaic roof tiles include a glass cover with texture of a micro scale on a first side, and one or more layers of a transparent material adjoining the first side of the textured glass configured to reflect light of a color. A glass cover can have texture on a first side and a layer of sphere shaped metal nanoparticles adjoining the first side of the textured glass cover. Directionally colored solar modules can include a textured glass cover with texture on a first side and a coating layer covering one or more facets of the texture on the first side of the glass cover. The coating layer may be deposited by coating the textured glass cover in one or more directions.

17 Claims, 13 Drawing Sheets

(51) Int. Cl.
*H02S 40/20* (2014.01)
*H02S 40/22* (2014.01)
*H01L 31/048* (2014.01)
*H01L 31/0216* (2014.01)
*H01L 31/0236* (2006.01)

(52) U.S. Cl.
CPC .. *H01L 31/02168* (2013.01); *H01L 31/02366* (2013.01); *H01L 31/048* (2013.01); *H02S 40/20* (2014.12); *H02S 40/22* (2014.12); *H01L 31/0488* (2013.01); *Y02E 10/50* (2013.01)

(56) References Cited

U.S. PATENT DOCUMENTS

| | | | |
|---|---|---|---|
| 4,239,810 A | 12/1980 | Alameddine | |
| 4,724,011 A | 2/1988 | Turner | |
| 5,118,540 A | 6/1992 | Hutchison | |
| 5,338,369 A | 8/1994 | Rawlings | |
| 5,427,961 A | 6/1995 | Takenouchi | |
| 5,667,596 A | 9/1997 | Tsuzuki | |
| 5,942,048 A | 8/1999 | Fujisaki | |
| 6,133,522 A | 10/2000 | Kataoka | |
| 6,311,436 B1 | 11/2001 | Mimura | |
| 6,365,824 B1 | 4/2002 | Nakazima | |
| 6,472,594 B1 | 10/2002 | Ichinose | |
| 6,586,271 B2 | 7/2003 | Hanoka | |
| 6,960,716 B2 | 11/2005 | Matsumi | |
| 7,259,321 B2 | 8/2007 | Oswald | |
| 7,276,724 B2 | 10/2007 | Sheats | |
| 7,506,477 B2 | 3/2009 | Flaherty | |
| 7,534,956 B2 | 5/2009 | Kataoka | |
| 7,772,484 B2 | 8/2010 | Li | |
| 7,833,808 B2 | 11/2010 | Xu | |
| 7,851,700 B2 | 12/2010 | Luch | |
| 7,858,874 B2 | 12/2010 | Ruskin | |
| 7,902,451 B2 | 3/2011 | Shimizu | |
| 7,964,440 B2 | 6/2011 | Salleo | |
| 8,205,400 B2 | 6/2012 | Allen | |
| 8,206,664 B2 | 6/2012 | Lin | |
| 8,276,329 B2 | 10/2012 | Lenox | |
| 8,471,141 B2 | 6/2013 | Stancel | |
| 8,664,030 B2 | 3/2014 | Luch | |
| 8,674,377 B2 | 3/2014 | Farquhar | |
| 8,701,360 B2 | 4/2014 | Ressler | |
| 8,713,861 B2 | 5/2014 | Desloover | |
| 8,822,810 B2 | 9/2014 | Luch | |
| 9,038,330 B2 | 5/2015 | Bellavia | |
| 9,150,966 B2 | 10/2015 | Xu | |
| 9,206,520 B2 | 12/2015 | Barr | |
| 9,343,592 B2 | 5/2016 | Hunt | |
| 9,362,527 B2 | 6/2016 | Takemura | |
| 9,412,884 B2 | 8/2016 | Heng | |
| 9,525,092 B2 | 12/2016 | Mayer | |
| 9,825,582 B2 | 11/2017 | Fernandes | |
| 9,899,554 B2 | 2/2018 | Yang | |
| 9,966,487 B2 | 5/2018 | Magnusdottir | |
| 2001/0054435 A1 | 12/2001 | Nagao | |
| 2002/0015782 A1 | 2/2002 | Abys | |
| 2003/0180983 A1 | 9/2003 | Oswald | |
| 2004/0261840 A1 | 12/2004 | Schmit | |
| 2005/0039788 A1 | 2/2005 | Blieske | |
| 2005/0268963 A1 | 12/2005 | Jordan | |
| 2006/0086620 A1 | 4/2006 | Chase | |
| 2006/0204730 A1* | 9/2006 | Nakamura | G02F 1/133512 428/195.1 |
| 2008/0135085 A1 | 6/2008 | Corrales | |
| 2009/0120497 A1 | 5/2009 | Schetty | |
| 2009/0233083 A1 | 9/2009 | Inoue | |
| 2009/0242021 A1 | 10/2009 | Petkie | |
| 2009/0308435 A1 | 12/2009 | Caiger | |
| 2010/0006147 A1 | 1/2010 | Nakashima | |
| 2010/0018568 A1 | 1/2010 | Nakata | |
| 2010/0132762 A1 | 6/2010 | Graham | |
| 2010/0180929 A1* | 7/2010 | Raymond | H01L 31/054 136/246 |
| 2011/0023942 A1 | 2/2011 | Soegding | |
| 2011/0030761 A1 | 2/2011 | Kalkanoglu | |
| 2011/0277825 A1 | 11/2011 | Fu | |
| 2012/0031470 A1 | 2/2012 | Dimov | |
| 2012/0048349 A1 | 3/2012 | Metin | |
| 2012/0060911 A1 | 3/2012 | Fu | |
| 2012/0125391 A1 | 5/2012 | Pinarbasi | |
| 2012/0199184 A1 | 8/2012 | Nie | |
| 2013/0048062 A1 | 2/2013 | Min | |
| 2013/0061913 A1 | 3/2013 | Willham | |
| 2013/0160823 A1 | 6/2013 | Khouri | |
| 2013/0206213 A1 | 8/2013 | He | |
| 2013/0209776 A1 | 8/2013 | Kim | |
| 2013/0233378 A1 | 9/2013 | Moslehi | |
| 2013/0247959 A1 | 9/2013 | Kwon | |
| 2013/0255755 A1 | 10/2013 | Chich | |
| 2013/0280521 A1 | 10/2013 | Mori | |
| 2014/0120699 A1 | 5/2014 | Hua | |
| 2014/0124014 A1 | 5/2014 | Morad | |
| 2014/0196768 A1 | 7/2014 | Heng et al. | |
| 2014/0313574 A1 | 10/2014 | Bills | |
| 2014/0360582 A1 | 12/2014 | Cui | |
| 2015/0090314 A1 | 4/2015 | Yang | |
| 2015/0155824 A1 | 6/2015 | Chien | |
| 2015/0194552 A1 | 7/2015 | Ogasahara | |
| 2015/0243931 A1* | 8/2015 | Fukuura | H01L 51/5268 257/98 |
| 2015/0270410 A1 | 9/2015 | Heng | |
| 2015/0349145 A1 | 12/2015 | Morad | |
| 2015/0349152 A1 | 12/2015 | Voss | |
| 2015/0349703 A1 | 12/2015 | Morad | |
| 2016/0013329 A1 | 1/2016 | Brophy | |
| 2016/0105144 A1 | 4/2016 | Haynes | |
| 2016/0163902 A1 | 6/2016 | Podlowski | |
| 2016/0181446 A1 | 6/2016 | Kalkanoglu | |
| 2016/0225931 A1 | 8/2016 | Heng | |
| 2017/0033250 A1* | 2/2017 | Ballif | F24J 2/0422 |
| 2017/0077343 A1 | 3/2017 | Morad | |
| 2017/0194516 A1 | 7/2017 | Reddy | |
| 2017/0222082 A1 | 8/2017 | Lin | |
| 2018/0166601 A1 | 6/2018 | Inaba | |

FOREIGN PATENT DOCUMENTS

| | | | |
|---|---|---|---|
| CN | 102956730 | 6/2016 | |
| DE | 102007054124 | 5/2009 | |
| EP | 1058320 | 12/2000 | |
| EP | 2051124 A2 | 4/2009 | |
| EP | 2709160 | 3/2014 | |
| GB | 2278618 | 12/1994 | |
| JP | S57141979 | 9/1982 | |
| JP | S6020586 | 2/1985 | |
| JP | H06140657 | 5/1994 | |
| JP | H06264571 | 9/1994 | |
| JP | 2000091610 | 3/2000 | |
| JP | 2000216415 | 8/2000 | |
| JP | 2013211385 | 10/2013 | |
| WO | 2008136872 | 11/2008 | |
| WO | 2009062106 | 5/2009 | |
| WO | 2009099418 | 8/2009 | |
| WO | 2010128375 | 11/2010 | |
| WO | 2011128757 | 10/2011 | |
| WO | 201359441 | 4/2013 | |
| WO | 2013067541 | 5/2013 | |
| WO | 2013102181 | 7/2013 | |
| WO | 2014178180 | 11/2014 | |
| WO | 2015155356 | 10/2015 | |
| WO | WO 2015155356 A1 * | 10/2015 | F24J 2/0422 |
| WO | 2016090341 | 6/2016 | |

OTHER PUBLICATIONS

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al. 2013.

(56) References Cited

OTHER PUBLICATIONS

"Recovery Act: Organic Coatings as Encapsulants for Low Cost, High Performance PV Modules" Jim Poole et al. Nov. 16, 2011.
Pelisset: "Efficiency of Silicon Thin-Film photovoltaic Modules with a Front Coloured Glass", Preceedings CISBAT 2011, Jan. 1, 2011, pp. 37-42, XP055049695, the Whole Document.

* cited by examiner

700

UNIFORMLY AND DIRECTIONALLY COLORED PHOTOVOLTAIC MODULES

CROSS-REFERENCE TO OTHER APPLICATIONS

This is related to U.S. patent application Ser. No. 15/294,042, entitled "COLORED PHOTOVOLTAIC MODULES" filed Oct. 14, 2016, the disclosure of which is incorporated herein by reference in its entirety for all purposes.

BACKGROUND

Field

This disclosure is generally related to the design of photovoltaic (or "PV") modules. More specifically, this disclosure is related to the design and manufacture of colored photovoltaic roof tiles.

Related Art

Commercial solar panels are constructed from arrays of photovoltaic (or "PV") modules. Each PV module, in turn, typically includes a two-dimensional array (e.g., 6×12) of solar cells. Usually, the color appearance of these modules is the natural color of the solar cells embedded in the PV modules, which can be blue, dark-blue, or black. But customers often wish to choose the color appearance of PV modules so that, for example, the modules match the color of the buildings in which they are integrated.

Several existing techniques are available to provide color to PV modules. One technique involves applying tinted glass and/or colored encapsulation sheets. However, these extra structures can absorb a large amount of sunlight, causing significant PV power loss. Moreover, these structures' color appearance may degrade over time.

Another coloration technique involves applying a film over the PV modules or solar cells. However, the color appearance achieved by the coatings on conventional glass typically suffers from flop, or angle-sensitivity, and can also degrade over time under environmental stresses (such as marine weather).

Shading, or absorption of incident sunlight, causes PV power loss, a consequential problem of existing coloring techniques. In addition, colored PV modules manufactured with these techniques, and colored glass more generally, commonly suffer from: sparkle, or glint; flop, or angle-dependent color appearance; and graininess. Note that sparkle refers to glint or localized bright spots. Flop, on the other hand, usually refers to angle-dependent color, i.e. an angular dependence of the peak reflected wavelength. The term flop, or light-dark flop, can also refer to angle-dependent brightness, i.e. an angular dependence of total reflectivity.

SUMMARY

One embodiment described herein provides a photovoltaic roof tile. This photovoltaic roof tile comprises a glass cover having a texture of a micro scale on a first side. Moreover, the photovoltaic roof tile comprises one or more layers of a transparent material configured to reflect light of a first color, wherein the one or more layers of transparent material adjoin the first side of the textured glass cover.

In a variation on this embodiment, the glass cover further has a patterned second texture comprising an array of features on the first side. The array of features includes at least one of: an array of grooves; an array of cones; an array of triangular pyramids; an array of triangular pyramids; an array of square pyramids; and an array of hexagonal pyramids.

In a variation on this embodiment, the transparent material comprises Aluminum Zinc Oxide or a transparent conductive oxide.

In a variation on this embodiment, the transparent material having the refractive index comprises silicon dioxide.

In a variation on this embodiment, the micro texture is chemically etched on the first side of the glass cover.

In a variation on this embodiment, the micro texture is blasted on the first side of the glass cover.

In another aspect of this disclosure, a photovoltaic roof tile is disclosed. This photovoltaic roof tile comprises a glass cover and a layer of sphere shaped metal nanoparticles adjoining a first side of the glass cover.

In a variation on this embodiment, the glass cover has a texture on the first side.

In a variation on this embodiment, the layer of sphere shaped metal nanoparticles comprises an outer layer of antimony and an inner layer of metal. The layer of sphere shaped metal nanoparticles is further annealed on the glass cover.

In a variation on this embodiment, the layer of nanoparticles is preferentially grown, dip-coated, or spin-coated on the first side of the glass cover.

In a variation on this embodiment, the metal nanoparticles comprise silver.

In a variation on this embodiment, the metal nanoparticles comprise gold.

In a variation on this embodiment, the metal nanoparticles comprise aluminum.

In another aspect of this disclosure, a directionally colored photovoltaic roof tile is disclosed. This directionally colored photovoltaic roof tile comprises a textured glass cover having a texture on a first side. The directionally colored photovoltaic roof tile further comprises a coating layer covering one or more facets of the texture on the first side of the glass cover, wherein the coating layer is deposited by coating the textured glass cover in one or more directions.

In a variation on this embodiment, the coating layer comprises metal nanoparticles.

In a variation on this embodiment, the coating layer comprises a transparent thin film configured to reflect a predetermined color based on interference.

In a variation on this embodiment, the deposited coating layer varies in thickness on different facets.

In a variation on this embodiment, the coating layer is configured to provide color for viewers at particular viewing angles, while enhancing optical transparency at other angles.

In a variation on this embodiment, the particular viewing angles comprise glancing angles below 20°.

In a variation on this embodiment, the coating layer is configured to create a variation in color across a glass cover of the photovoltaic roof tile.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Various embodiments disclosed herein provide solutions to manufacturing uniformly and/or directionally colored photovoltaic (PV) modules or roof tiles. Embodiments of the present invention can produce PV roof tiles with a uniform color with little light absorption. As a result, a high proportion of the incident light (of colors other than the module's intended color) is transmitted to the PV cells. To facilitate uniform coloring of PV modules and roof tiles, the inside surface of a top glass cover can be texturized, and a transparent material with a predetermined refractive index or combination of refractive indices can be deposited on the texturized surface. Such a micro-textured or frosted glass cover can display significantly less sparkle, flop, and graininess than conventional glass covers, thus improving color uniformity and appearance. Customizable directional coloring, and intentionally controlled angle-dependent color, can provide further aesthetic options, while still performing efficiently for solar conversion.

It is also possible to produce a layer of sphere-shaped metal nanoparticles on the inside surface of the glass cover. These nanoparticles can produce colors efficiently while absorbing little light.

Another feature described herein is directional coloring of PV modules or roof tiles. The texturized surface of a glass cover can have a color filter layer covering one or more facets of the texture. This color filter can include multiple thin film layers formed using a directional thin film deposition technique, such as chemical or physical vapor deposition (CVD or PVD), e.g. sputtering. The coating layer can be deposited by coating the textured glass surface in one or more directions. Such directional coating can reduce unwanted light absorption by the color filter, while still providing a uniform color appearance to viewers at a certain viewing angle.

PV Roof Tiles and Modules

Figure 1:
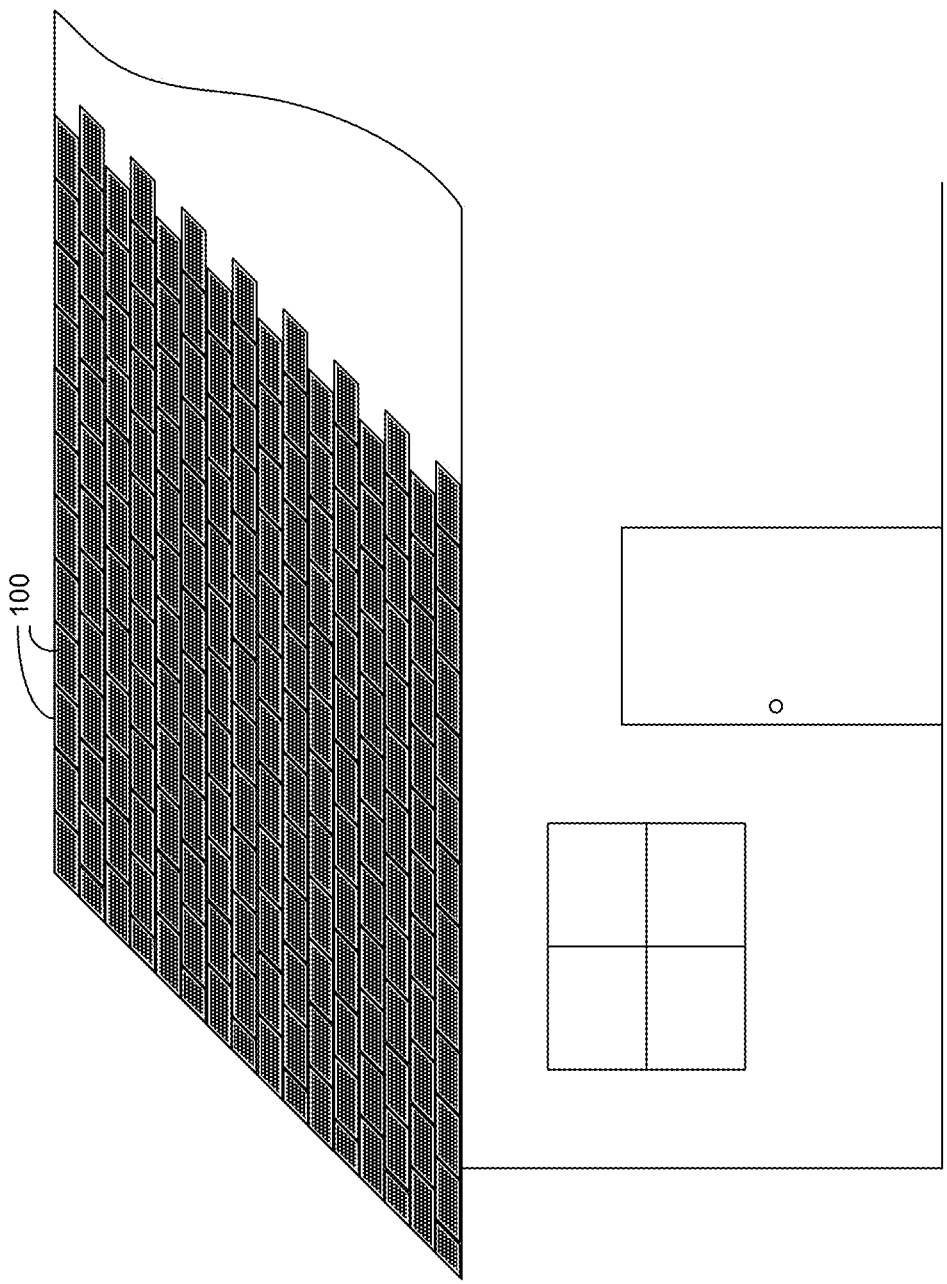
FIG. 1 shows an exemplary configuration of photovoltaic roof tiles on a house.

The disclosed system and methods may be used to provide uniform coloring and/or directional coloring of PV roof tiles and PV modules. Such PV roof tiles provide the functions of conventional roof tiles and of solar cells, while also protecting the solar cells. FIG. 1 shows an exemplary configuration of PV roof tiles on a house. PV roof tiles 100 can be installed on a house like conventional roof tiles or shingles. Particularly, a photovoltaic roof tile can be placed with other tiles in such a way to prevent water from entering the building.

A respective solar cell can include one or more electrodes such as busbars and finger lines, and can connect mechanically and electrically to other cells. Solar cells can be electrically coupled by a tab, via their respective busbars, to create serial or parallel connections. Moreover, electrical connections can be made between two adjacent tiles to interconnect multiple tiles into a module, so that a number of photovoltaic tiles can jointly provide electrical power. A PV module typically includes an array such as 6×12 solar cells.

Figure 2:
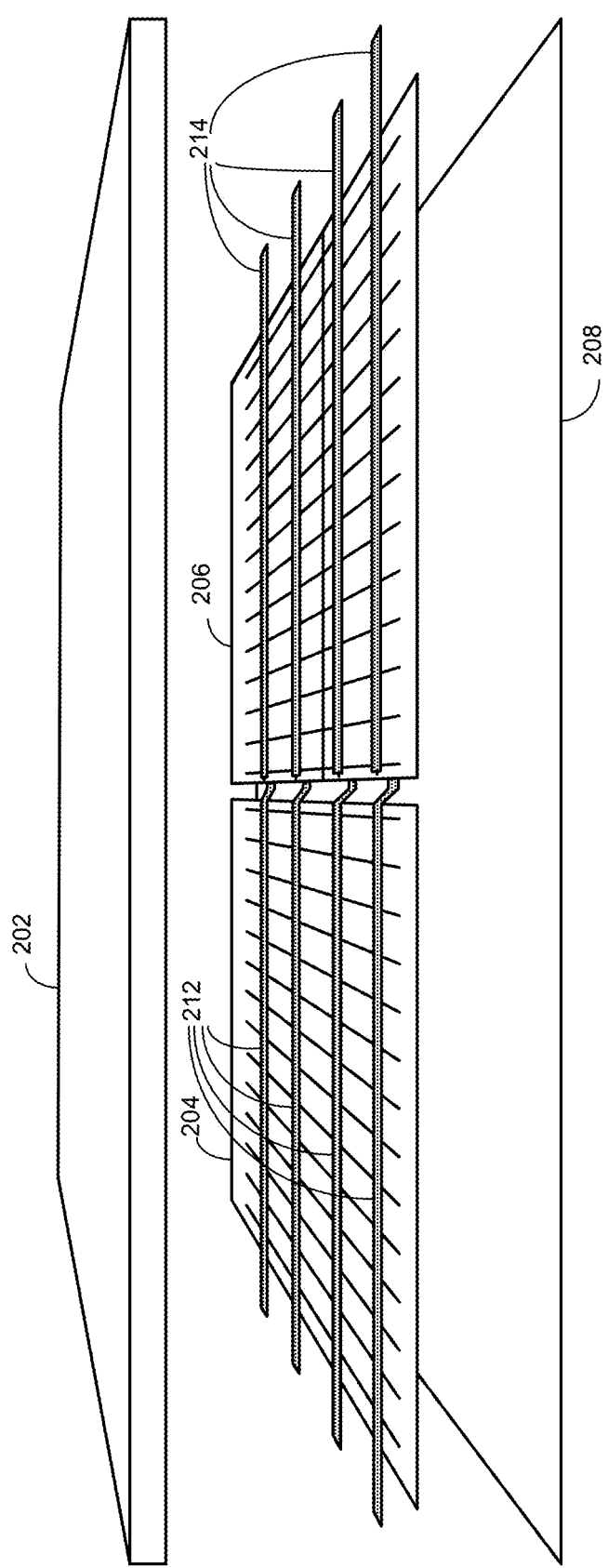
FIG. 2 shows a perspective view of the configuration of a photovoltaic roof tile.

FIG. 2 shows a perspective view of the configuration of a photovoltaic roof tile. In this view, solar cells 204 and 206 can be hermetically sealed between top glass cover 202 and backsheet 208, which jointly can protect the solar cells from the weather elements. Tabbing strips 212 can be in contact with the front-side busbars of solar cell 204 and extend beyond the left edge of glass 202, thereby serving as contact electrodes of a first polarity of the photovoltaic roof tile. Tabbing strips 212 can also be in contact with the back side of solar cell 206, creating a serial connection between solar cell 204 and solar cell 206. Tabbing strips 214 can be in contact with front-side busbars of solar cell 216 and extend beyond the right-side edge of glass cover 202.

Using long tabbing strips that can cover a substantial portion of a front-side busbar can ensure sufficient electrical contact between the tabbing strip and the busbar, thereby reducing the likelihood of detachment between the tabbing strip and busbar. Furthermore, the four tabbing strips being sealed between the glass cover and backsheet can improve the physical durability of the photovoltaic roof tile.

Figure 3:
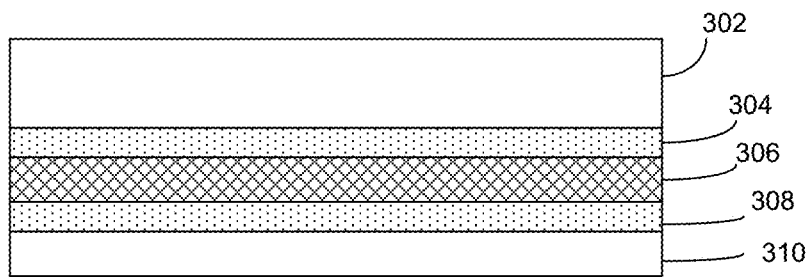
FIG. 3 shows the cross section of an exemplary photovoltaic roof tile.

FIG. 3 shows the cross section of an exemplary photovoltaic roof tile. In this example, solar cell 306 can be encapsulated by top glass cover 302 and backsheet 310. Top encapsulant layer 304, which can be based on a polymer such as ethylene vinyl acetate (EVA), can be used to seal between top glass cover 302 and solar cell 306. Similarly, lower encapsulant layer 308, which can be based on EVA as well, can be used to seal between solar cell 306 and backsheet 310.

Figure 4A:
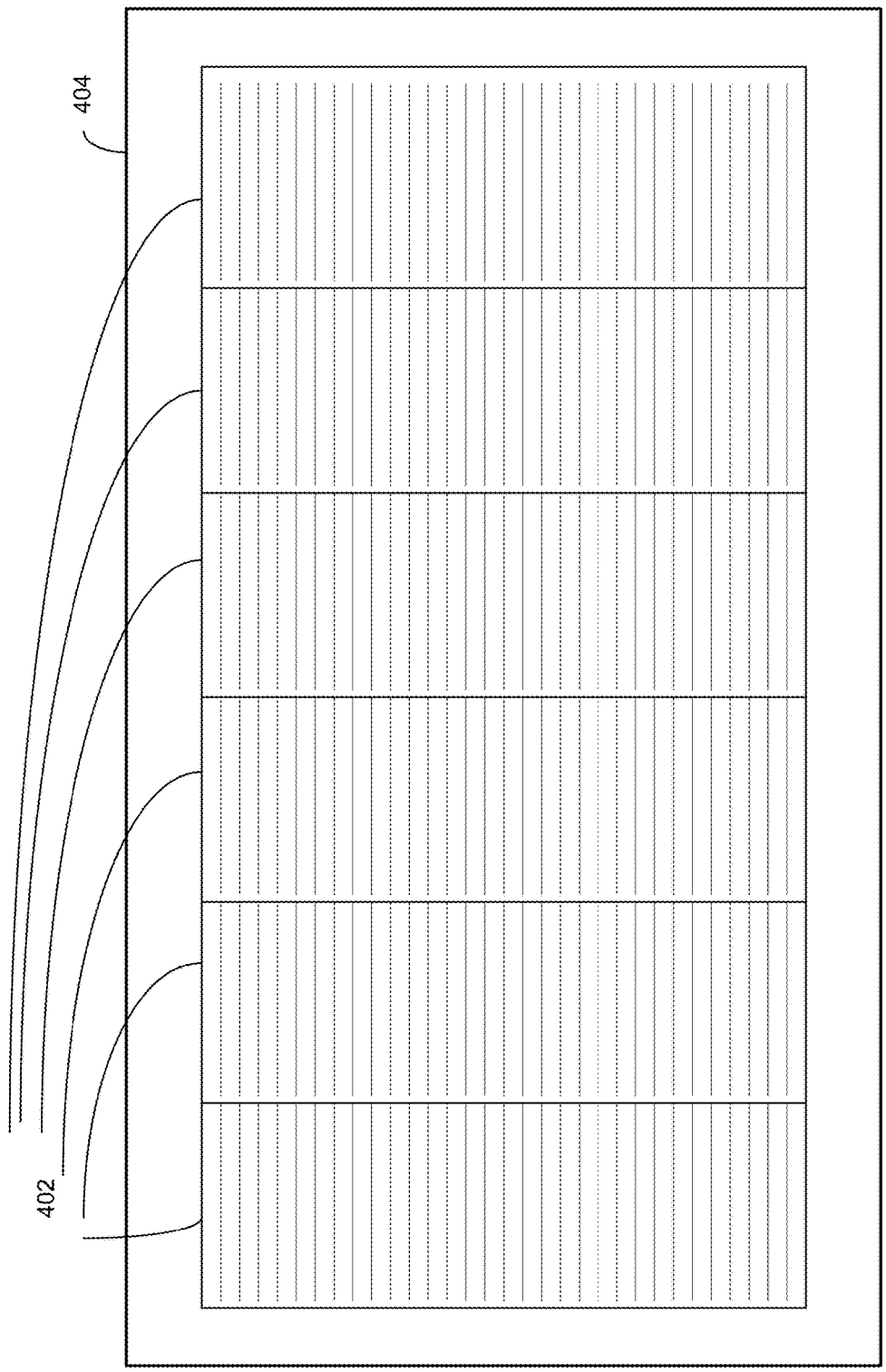
FIG. 4A shows an exemplary configuration of photovoltaic roof tile with cascaded solar cell strips.
Figure 4B:
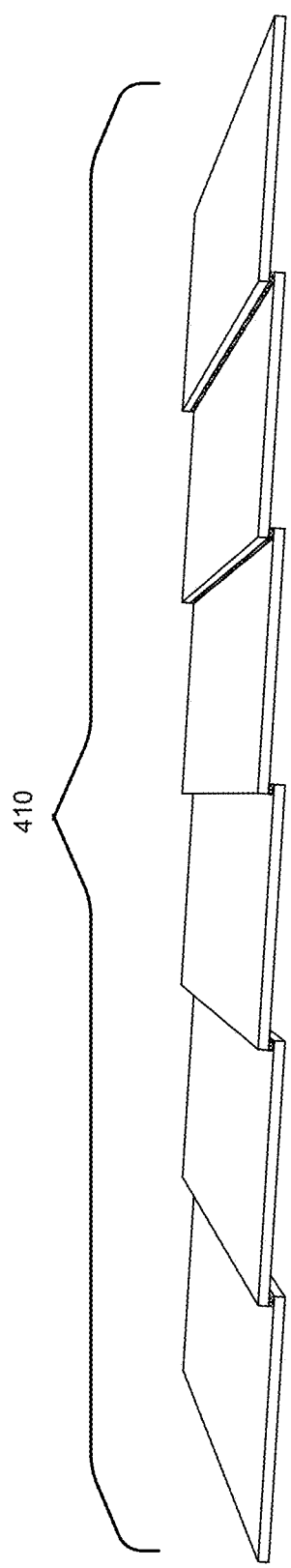
FIG. 4B shows cascading of solar cell strips by overlapping their respective edges.

FIG. 4A shows an exemplary configuration of photovoltaic roof tile with cascaded solar cell strips, according to one embodiment of the present invention. In this example, top glass cover 404 and a backsheet (not shown) can enclose six solar cell strips 402, which can be produced by dividing two solar cells. As shown in FIG. 4B, solar cell strips 402 can be cascaded by overlapping their respective edges. In particular, each strip can have a busbar on one of its edges on the front side. The back side of the strip can be coated with metal. When two strips are cascaded, the edge busbar of the first strip can be positioned to be in contact with the back-side metal layer of the adjacent strip.

PV roof tiles and modules are described in more detail in Provisional Patent Application No. 62/465,694, entitled "SYSTEM AND METHOD FOR PACKAGING PHOTOVOLTAIC ROOF TILES" filed Mar. 1, 2017, which is incorporated herein by reference. The embodiments disclosed herein can be applied to solar cells, PV roof tiles, and/or PV modules.

Uniformly Colored PV Roof Tiles and Modules

Figure 5A:
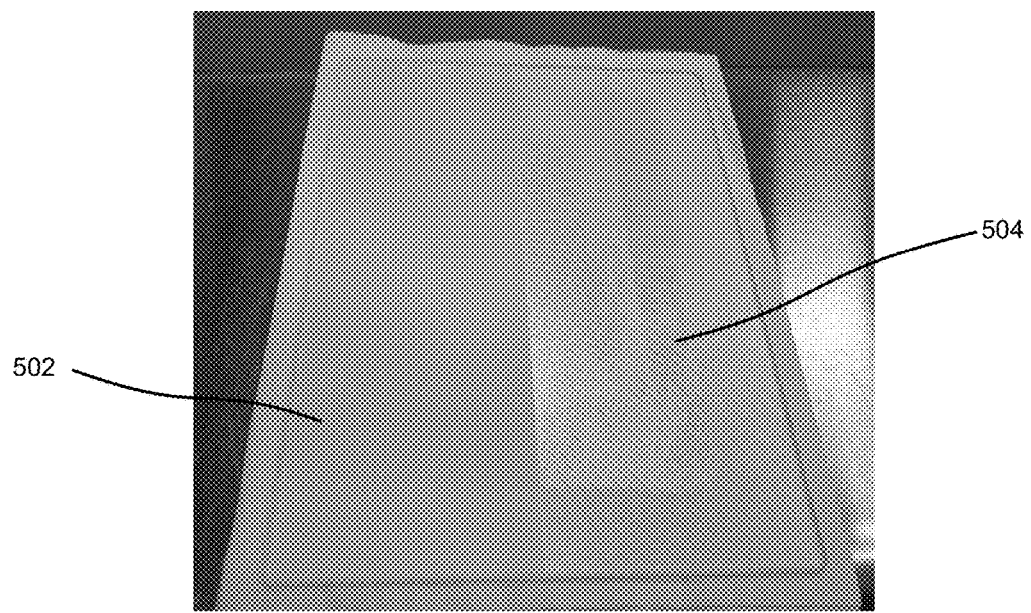
FIGS. 5A and 5B illustrate a comparison of micro-textured uniformly colored glass to conventional glass.
Figure 5B:
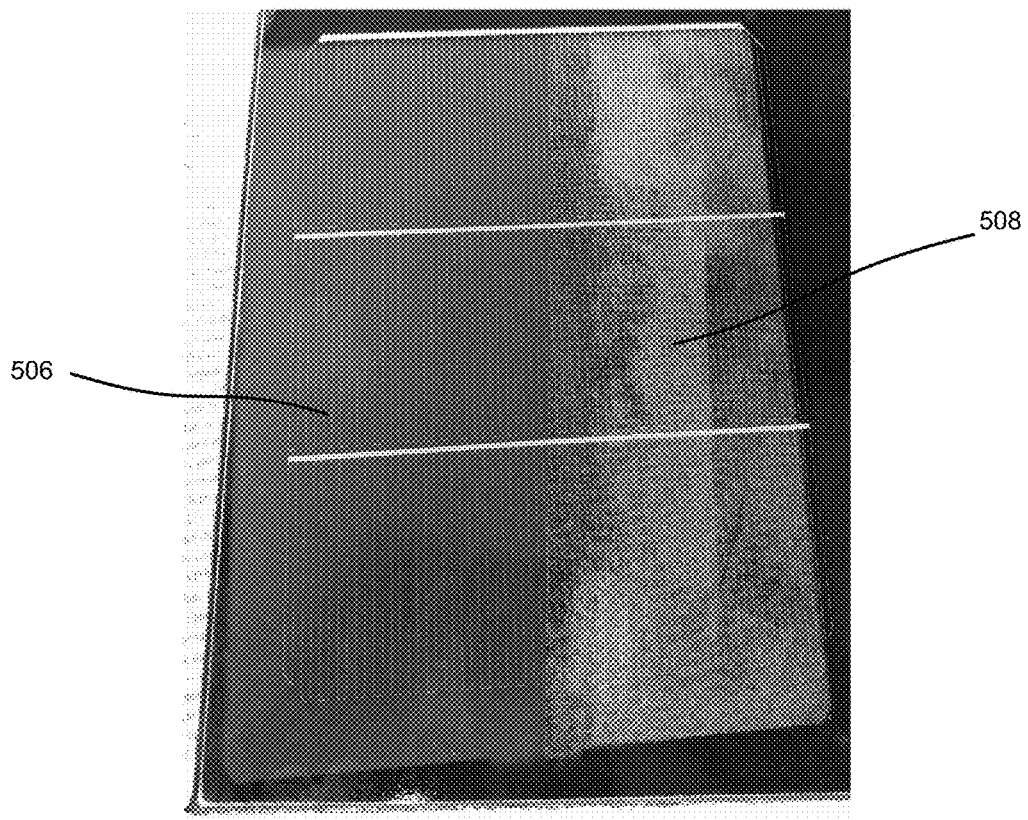

FIGS. 5A and 5B illustrate a comparison of micro-textured uniformly colored glass to conventional glass. As can be seen on the right side of FIG. 5A, colored glass 504 typically suffers from: sparkle, or glare; flop, or angle-dependent coloring; and graininess. However, micro-structured glass 502 with micro-texture can display substantially less of each of these problems. (Note that, in various embodiments, the micro-structured glass 102 may have surface roughness on the order of 100 nm to 10 μm, with comparable peak-to-peak separation). Likewise, as shown in FIG. 5B, micro-textured or frosted glass 506 can exhibit little to no sparkle, flop, and graininess, whereas conventional glass 508 shows significant sparkle and graininess. The micro-textured glass can achieve this feature by introducing roughness in order to randomize the glass-color filter interface, thereby averaging over many incident angles.

Table 1 presents details of the improvements in micro-structured glass in terms of sparkle (or glint), flop (or angle-dependent color appearance), and graininess, compared with conventional glass. These measurements indicate that frosting can reduce light-dark flop (or angle-dependent brightness) by 7-10 times (as measured by the flop index of Table 1), color flop by 5-8 times, and sparkle by at least 30 times.

TABLE 1

Details of the improvements in micro-structured glass compared with conventional glass.

| Characteristic | Frosted Glass | Conventional Glass |
| --- | --- | --- |
| Flop index | 1.6-2.1 | 14.5-17.1 |
| Sparkle intensity | 0.1-0.8 | 16-32 |
| Sparkle area | 0-1 | 35-49 |
| Graininess | 3.4-3.5 | 5.6-6.1 |

Figure 6A:
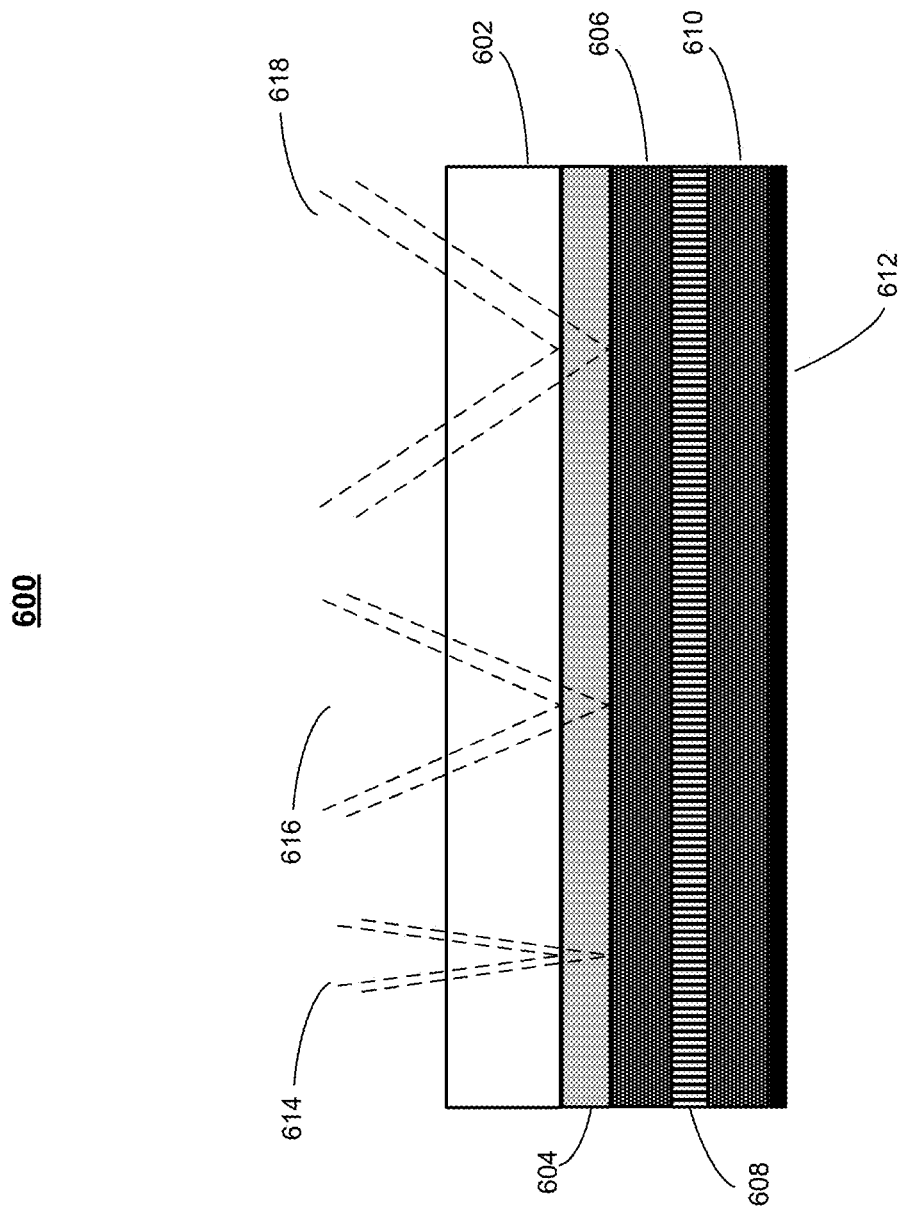
FIG. 6A illustrates angular dependence of coloring in photovoltaic roof tiles due to interference effects.

In colored PV modules made with conventional glass, the flop, or angular dependence, of color can be caused by interference between light reflected from different surfaces of the solar module. FIG. 6A illustrates angular dependence of coloring in photovoltaic roof tiles due to interference effects. As shown, PV module 600 may include transparent glass cover 602. Module 600 may also contain a color filter 604 that may comprise one or more layers of optical coating. Color filter 604 may contain a transparent conductive oxide (TCO) such as Iridium Tin Oxide (ITO) or Aluminum-doped Zinc Oxide (AZO). Color filter 604 may include a multi-layer stack containing one or more of: a high refraction index (e.g., n=1.7-2.5) material, such as $TiO_2$, $Ta_2O_5$, $NbO_2$, ZnO, $SnO_2$, $In_2O_3$, $Si_3N_4$, and AZO; a low refraction index (e.g., n=1.2-1.5) material, such as $SiO_2$, $MgF_2$; and a metal, such as Ag, Cu, and Au. Color filter 604 may be deposited by physical vapor deposition (PVD), chemical vapor deposition (CVD), or other deposition methods.

Module 600 may also contain encapsulant sheet 606, which can be polyvinyl butyral (PVB), thermoplastic olefin (TPO), ethylene vinyl acetate (EVA), or N,N'-diphenyl-N,N'-bis(3-methylphenyl)-1,1'-diphenyl-4,4'-diamine (TPD). Module 600 also contains array of solar cells 608. In some embodiments, module 600 contains back encapsulant sheet 610 and back-side cover layer 612 positioned on the back side of PV module 600, opposite to glass cover 602.

In embodiments of the present invention, the color filter produces color by means of wavelength selective reflection, which may exhibit angular dependence caused by interference effects. To produce the desired colors, color filter 604 may have a thickness in the range of hundreds of nanometers, comparable to visible light wavelengths. As shown, light incident on the solar module could reflect at the interface of glass 602 and color filter 604, or could reflect at the interface of color filter 604 and encapsulant 606. Light traveling along these two different reflecting paths has different optical path lengths, and therefore interferes constructively or destructively depending on this difference.

As shown in FIG. 6A, the path length difference depends on the incident angle. For example, steep angle 614, moderate angle 616, and shallow angle 618 produce different path lengths. Since interference depends on both the path difference and the light wavelength, different wavelengths of light have interference maxima at different angles, resulting in color flop (angle-dependence in the color of reflected light).

Figure 6B:
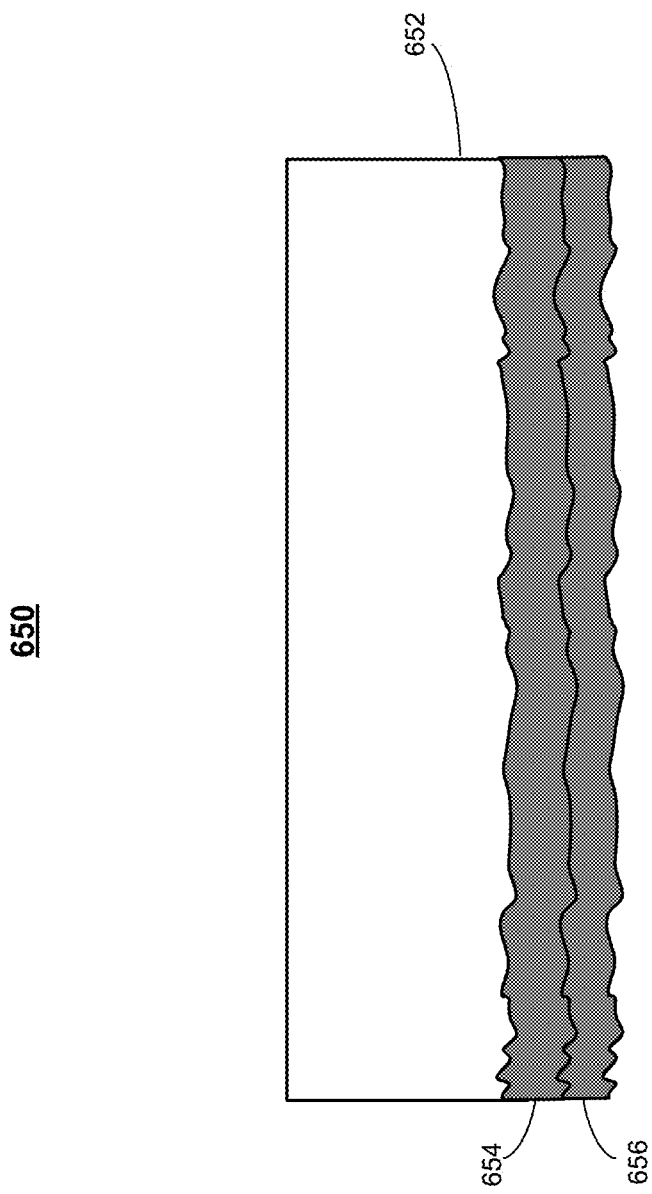
FIG. 6B presents an exemplary structure of a uniformly colored photovoltaic roof tile with micro-texture and a color filter, according to embodiments of the present invention.

Various embodiments disclosed herein provide solutions to ameliorate this flop effect using a micro-textured glass cover. FIG. 6B presents an exemplary structure of a uniformly colored PV roof tile 650 with micro-texture and layers of color filter, according to an embodiment of the present invention. As shown, glass cover 652 may be frosted or micro-textured on its inner surface, i.e. the surface adjoining the layers of color filter 654 and 656. This micro-texture may be frosting, or random surface roughness, such as a series of small bumps or indentations on the surface of the glass. In some embodiments, the micro-texture may be in addition to larger-scale texture on the glass, such as a groove, cone, or pyramid pattern. However, the micro-texture is at a different, typically smaller, scale. By randomizing the surface orientation, the micro-texture can average incoming light over a plurality of incident angles, thereby eliminating or significantly reducing the flop effect, as shown in FIGS. 5A and 5B and Table 1.

In some embodiments, the micro-texture can be chemically etched on the glass. The chemical etching may involve using a paste containing Hydrogen Fluoride (HF). The micro-texture can also be produced by using a process where particles are used to blast on the glass surface.

Note that the frosted glass may face a tradeoff between flop reduction and loss of color brightness or power because the frosting diffuses the light reflected from the PV module. In some embodiments, the micro-texturing may be optimized together with coating thickness for colored solar modules. In addition, the micro-texturing may be combined with larger-scale textures on the glass (e.g. a regular or irregular array or pattern of features) to provide finer control over the directional dependence of color appearance.

Uniformly Colored Solar Module with Nanoparticles

Embodiments of the present invention may also provide a uniformly colored solar module with spherical metal nanoparticles positioned on the inside surface of the glass. Such layers of nanoparticles can produce colors while absorbing little light, particularly when the particles are of sufficiently large radius. Rather than absorbing, the nanoparticles instead transmit or scatter a majority of the incident light, depending on the wavelength. Note that transmission of the light to the PV cells 608 allows it to be converted to electricity in the cells, and scattering provides color; by contrast, absorption generates waste heat, degrading efficiency. Moreover, the nanoparticles can provide color in a way that minimizes or reduces sparkle or glare. In these embodiments, the metal nanoparticles may replace the physical vapor deposition (PVD) layer of optical coating 654. The nanoparticles may also replace the micro-textured or frosted glass, while providing both color selection and uniformity.

Figure 7A:
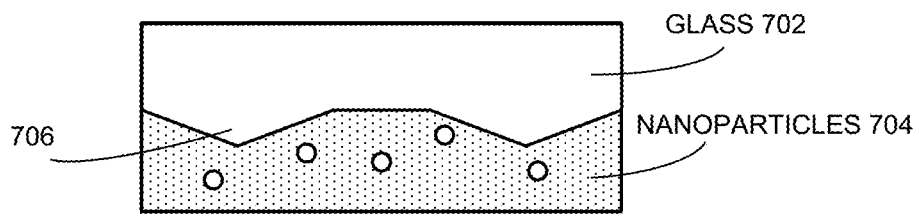
FIG. 7A shows an exemplary structure of a uniformly colored photovoltaic roof tile with a layer of nanoparticles, according to embodiments of the present invention.

FIG. 7A shows an exemplary structure of a uniformly colored photovoltaic roof tile 700 with a layer of nanoparticles, according to embodiments of the present invention. Nanoparticle layer 704 may be positioned on one surface of glass cover 702. Glass cover 702 may also have textured surface 706. Typically nanoparticle layer 704 can be on the textured surface of glass cover 702. Note that glass cover 702 need not have texturized surface 706. The metal nanoparticles may include silver (for example, 75 nm diameter spherical Ag particles), gold, aluminum, or other metals. The nanoparticles can be included in another film coating, such as silica, titania, or silicon nitride.

Figure 7B:
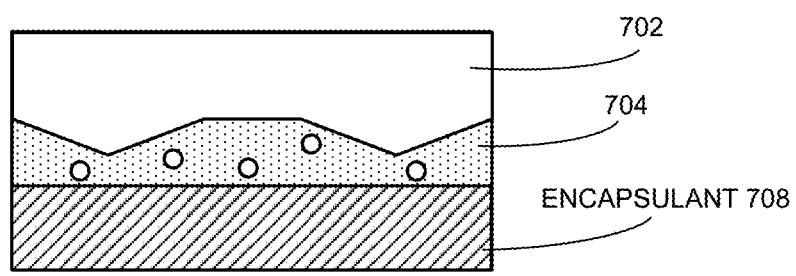
FIG. 7B shows an exemplary structure of a uniformly colored photovoltaic roof tile encapsulating a layer of nanoparticles, according to embodiments of the present invention.

Alternatively, the nanoparticles can be directly encapsulated into the PV module. FIG. 7B shows an exemplary structure of a uniformly colored photovoltaic roof tile encapsulating a layer of nanoparticles, according to embodiments of the present invention. As shown, nanoparticle layer 704 may be encapsulated by encapsulant layer 708, which can be based on materials such as PVB, TPO, EVA, or TPD.

Figure 8:
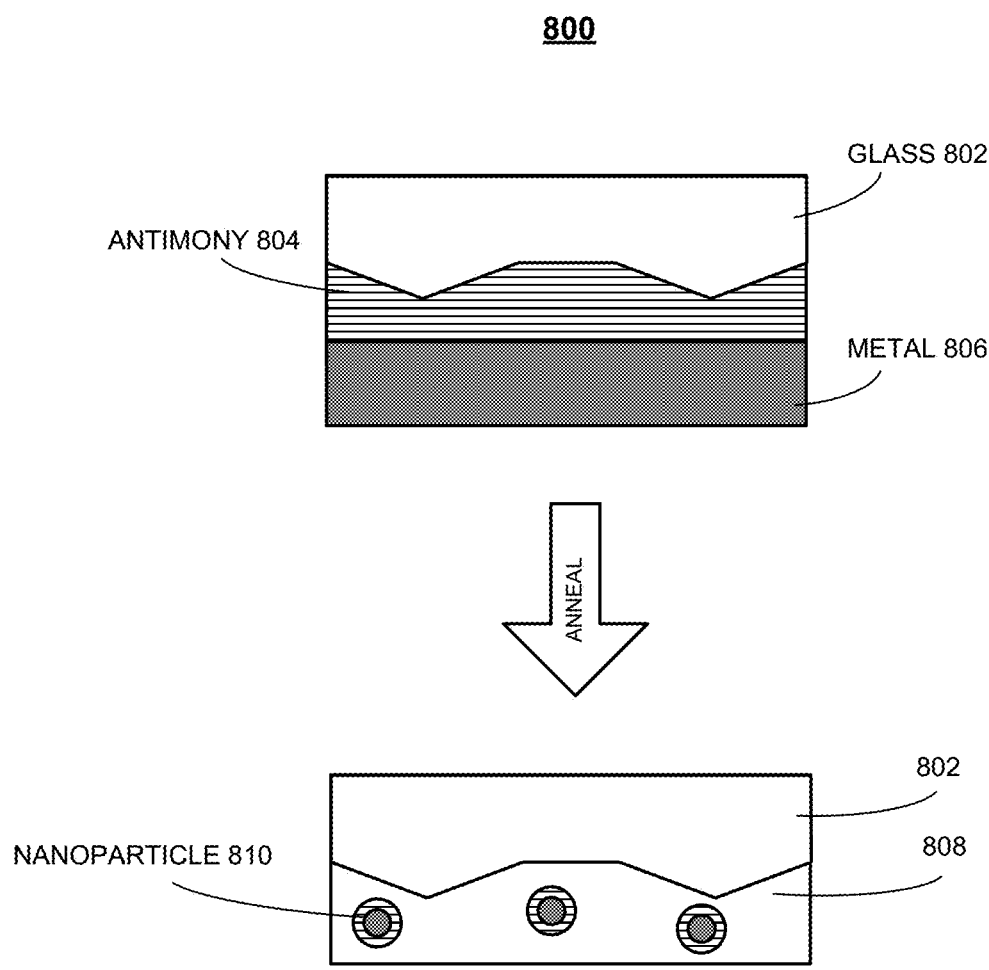
FIG. 8 illustrates an exemplary process for depositing a layer of nanoparticles in a uniformly colored photovoltaic roof tile by annealing, according to embodiments of the present invention.

In some embodiments, the nanoparticle layer may be deposited by dip-coating or spin-coating the nanoparticles onto the surface of glass cover 702. The nanoparticle layer may also be deposited by preferentially forming the nanoparticles on one side of the glass. FIG. 8 illustrates an exemplary process 800 for depositing a layer of nanoparticles in a uniformly colored photovoltaic roof tile by annealing, according to embodiments of the present invention. As shown, glass cover 802 may be covered on one side by an underlayer of antimony 804 and a layer of metal 806. The glass cover assembly may then be annealed, during which the exposure to heat causes the antimony to sublimate. During annealing, the antimony sublimates, leading to a solid state dewetting process where layer 808 of nanoparticles 810 is formed on the surface of the glass. The sublimating antimony may carry with it excess portions of metal. Note that nanoparticles 810 may contain both the antimony and the metal.

Figure 9:
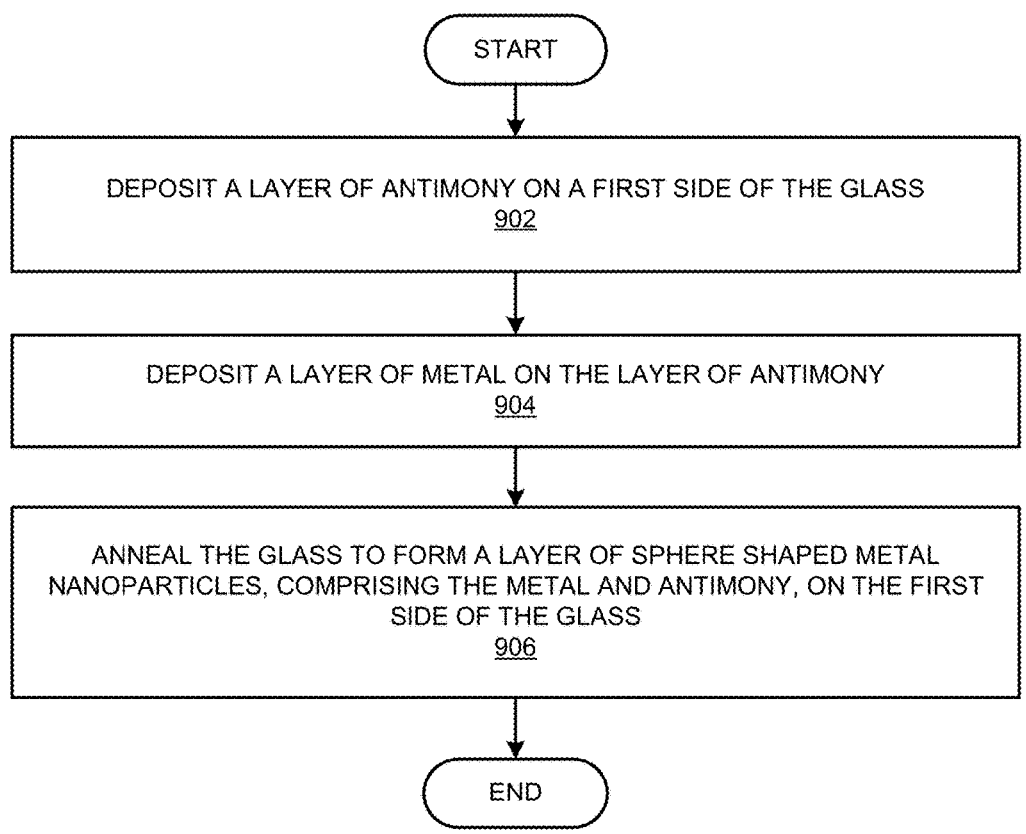
FIG. 9 shows a block diagram illustrating a method for depositing a layer of nanoparticles in a uniformly colored photovoltaic roof tile, according to embodiments of the present invention.

FIG. 9 shows a block diagram illustrating a method for depositing a layer of nanoparticles in a uniformly colored photovoltaic roof tile, according to embodiments of the present invention. As described above, the process includes depositing a layer of antimony on a first side of the glass cover (operation 902), for example by CVD or PVD. Next, a layer of metal is deposited on the antimony layer (operation 904). The thickness of the antimony layer and metal layer can be adjusted to control the spacing and density of deposited nanoparticles, and hence the intensity of color of the reflected light. In one embodiment, antimony and metal layers thinner than 20 nm are used to create strongly scattering nanoparticles. Therefore, the layers can be deposited very efficiently by physical vapor deposition (PVD). Aside from PVD, the antimony and metal layers may be deposited by CVD, atomic layer deposition (ALD), or other deposition methods. The glass cover is then annealed to form a layer of sphere shaped metal nanoparticles, which can include metal and antimony (operation 906).

Figure 10:
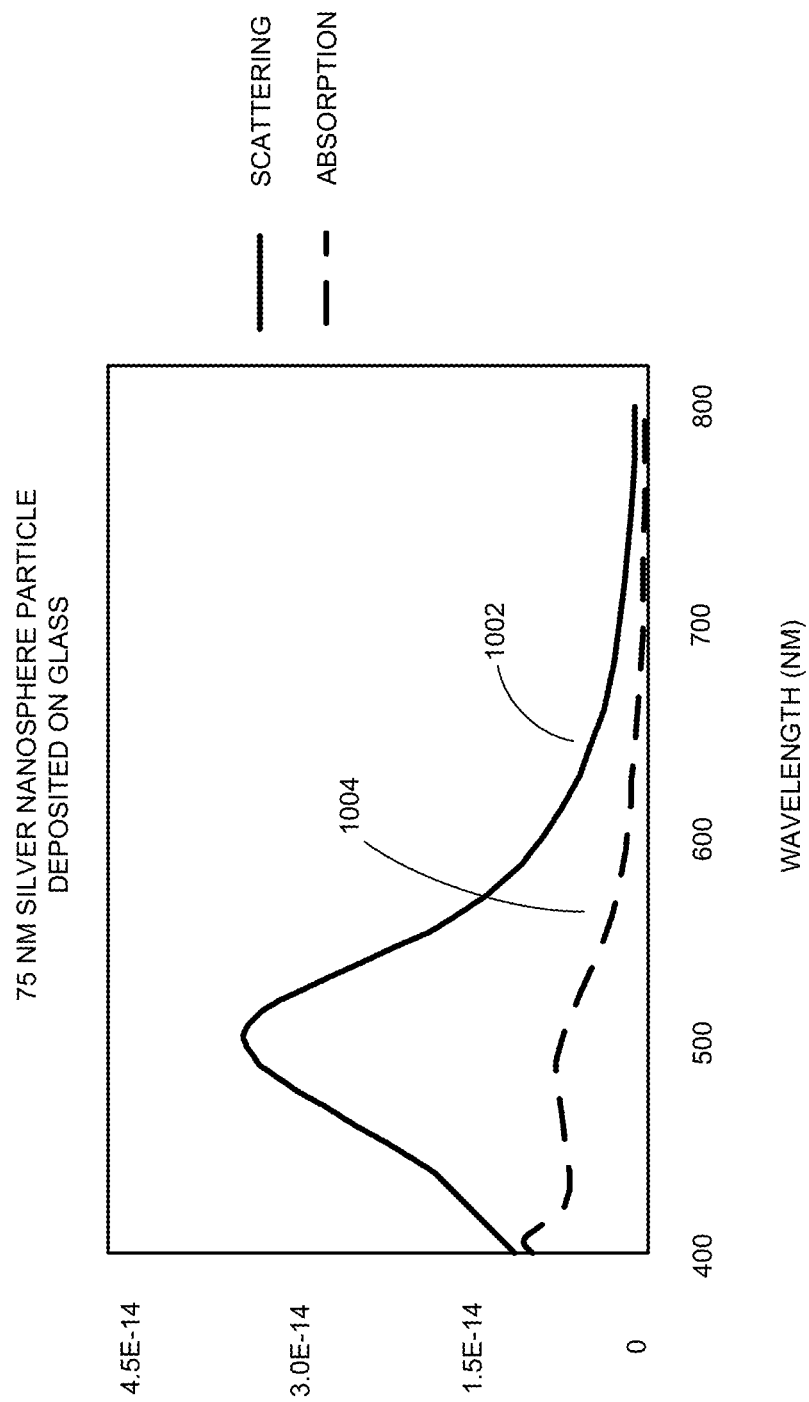
FIG. 10 shows a plot illustrating rates of scattering and absorption by a 75-nm silver nanosphere on glass, for various wavelengths of light.

FIG. 10 shows a plot illustrating rates of scattering and absorption by a layer of 75-nm silver nanosphere particles deposited on glass, for various wavelengths of light. As discussed above, scattering provides color to the solar module, whereas low absorption indicates that the nanoparticles are efficient at transmitting the non-scattered light to the PV cells. As shown in FIG. 10, scattering by the 75-nm silver nanosphere particles peaks at wavelength of approximately 500 nm, corresponding to a blue-green color, with a half width at half maximum (HWHM) of approximately 50 nm. By contrast, absorption is uniformly low throughout the visible wavelength range of 400 to 800 nm.

Directional and Multi-Directional Coating of Textured Solar Modules

Existing solutions for colored PV modules, such as tinted glass and colored encapsulation sheets, may suffer from strong shading, or absorption of incident sunlight by the colored surfaces, causing power loss in the PV modules. In order to manage better such a tradeoff between color and optical transmission, embodiments of the present invention provide partially-coated, textured solar modules, where some texture facets may be coated more than others.

To reduce losses in the color filter, in some embodiments the glass cover may have a textured inner surface. Note that this texture is different from the micro-texture or frosting described earlier, and is typically at a larger scale. This textured surface can be configured to cause a majority of the incident light received by the PV module to reflect at least twice on the textured interface, such that wavelength-selective reflections by the color filter include primarily multiple-reflected light. The textured surface can also be designed to control the amount of reflection loss by increasing or decreasing the number of reflections of the incident light on the textured interface. The textured surface may include an array of features, such as an array of grooves, cones, or pyramids (e.g., triangular pyramids, square pyramids, or hexagonal pyramids). This textured back surface is described further in U.S. patent application Ser. No. 15/294,042, entitled "COLORED PHOTOVOLTAIC MODULES" filed Oct. 14, 2016, which is incorporated herein by reference. As described here, these textured surfaces can be directionally coated.

Figures 11A, 11B:
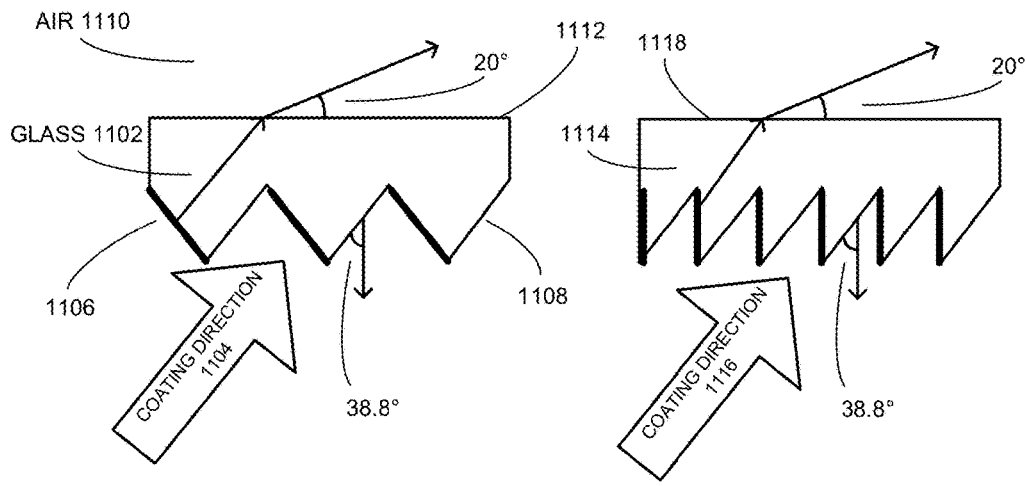
FIG. 11A shows an example of directional coating of textured photovoltaic roof tiles, according to embodiments of the present invention.
FIG. 11B shows an example of directional coating of textured photovoltaic roof tile facets perpendicular to a glass-air interface, according to embodiments of the present invention.

FIG. 11A shows an example of directional coating of textured photovoltaic roof tiles, according to embodiments of the present invention. Textured glass 1102 can be part of a solar module, for example on a residential or commercial roof, or on a vertically-oriented window of a tall building. Therefore, glass 1102 might typically be viewed only from observers at certain angles. For example, glass 1102 on a roof would be viewed by viewers at ground level mainly from shallow angles such as 20° or less, as shown.

The textured surface of glass 1102 can be coated directionally in direction 1104. This coating can be a chemical coating, or may include nanoparticles if the coating is followed by a dewetting process, such as the methods described in conjunction with FIGS. 8 and 9. Color can also be created by film interference effects created by transparent films. This directional coating can be accomplished by directional PVD, e.g. from a point source, in order to coat the textured surface selectively. For example, as shown, facet 1106 can be coated, while facet 1108 of glass 1102 can be uncoated. This selective or directional coating can ameliorate optical transmission in the colored PV module, and also save coating material, since the surface of glass 1102 does not need to be fully coated. Such coating thickness variation can create an aesthetic texture with color variation, or create viewing angle-dependent coloring, while enhancing transmission at other angles.

Coating direction 1104 can be chosen so that a viewer from shallow angles would see solid color, as reflected from the coated facets 1106. In practical usage, glass 1102 is exposed to air 1110, and therefore light reflected from facet 1106 refracts at the interface 1112 between glass 1102 and air 1110. The texture of the glass may be chosen to achieve particular angles between the texture facet and interfacing surface 1112, for example a groove angle of 38.8° with respect to the normal direction. Moreover, these texture angles can be chosen so light reflected from the coated surface is visible to a low-angle observer. For example, light reflected normally from the coated groove facet 1106 refracts at glass-air interface 1112, so that an observer sees solid color from angles of 20° or less.

Given these relationships between the texture geometry and the expected viewing angles, coating direction 1104 can be chosen to enhance transmission and save coating material while providing a desired color to the observer. For example, as shown in FIG. 11A, coating direction 1104 could be chosen at a normal or near-normal direction to facet surface 1106, in order to cover facet 1106 economically while leaving facet 1108 uncovered. Other directions are also possible, to give different coverage.

FIG. 11B shows an example of directional coating of textured photovoltaic roof tile facets perpendicular to a glass-air interface, according to embodiments of the present invention. As mentioned above, the textured glass can be designed to cause incident light to reflect multiple times. For example, textured glass 1114 can have a sawtooth texture. Here coating direction 1116 cannot be exactly perpendicular to the coated surfaces (since these surfaces would block each other during coating), but still may be chosen, e.g., parallel to the uncoated surfaces. Note that the uncoated surfaces in this example still make an angle of 38.8° with the normal direction to glass-air interface 1118, so the observer can still see the desired color from angles of 20° or less. Note also that for glass 1102, light incident normal to surface 1112 would be shaded by the coating material 50% less than for a fully coated surface, since only half the textured surface is coated. For glass 1114, however, the coated surfaces are perpendicular to glass-air interface 1118, so normally-incident light would be virtually unshaded by the coating. Thus, directional coating can significantly improve optical transmission.

Figures 11C, 11D:
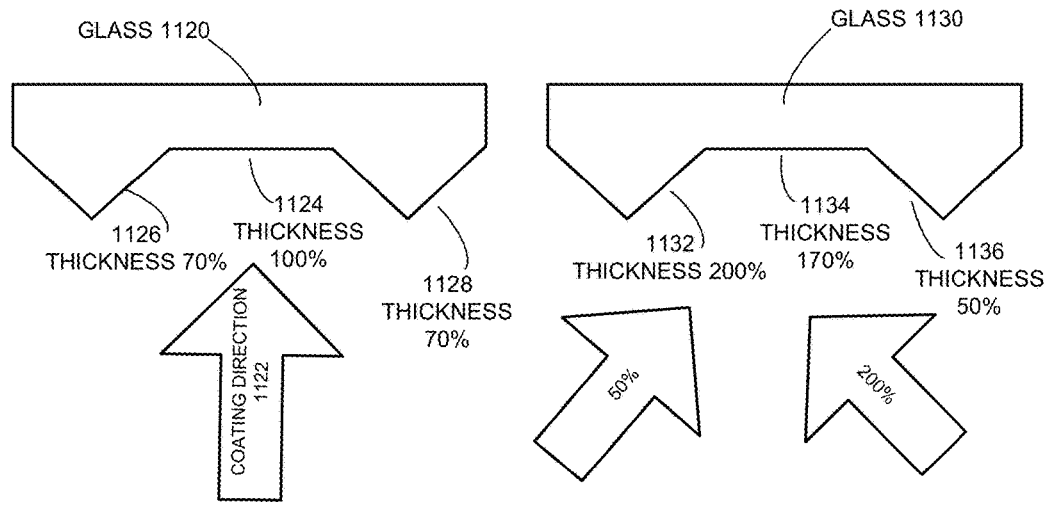
FIG. 11C illustrates a variation in coating thickness resulting from directional coating of textured photovoltaic roof tiles, according to embodiments of the present invention.
FIG. 11D illustrates multi-directional coating of textured photovoltaic roof tiles, according to embodiments of the present invention.

Moreover, directional and multi-directional coating (i.e., coating the textured surface from one or more sources in a plurality of directions) may be used to vary coverage in more complex ways. FIG. 11C illustrates a variation in coating thickness resulting from directional coating of textured photovoltaic roof tiles, according to embodiments of the present invention. As shown, textured glass 1120 is coated in direction 1122 perpendicular to facet 1124, but not parallel to any of the facets. The coating thickness on a respective facet generally depends on the angle between the facet and the incident coating flux. In the examples shown in FIGS. 11C and 11D, the coating thickness is indicated in terms of a percentage with respect to the thickness resulting from a coating flux perpendicular to the coated surface, e.g. coating flux 1122 in the example in FIG. 11C. Thus, facet 1124 has a 100% coating thickness, while facets 1126 and 1128 are coated at 70% thickness.

FIG. 11D illustrates multi-directional coating of textured photovoltaic roof tiles, according to embodiments of the present invention. Multi-directional coating can further increase the complexity, thickness variation, and coloring of PV modules. For example, glass 1130 can be coated in two separate directions of varying flux strengths 50% and 200%, as shown. As a result, facet 1132 is coated with 200% thickness, facet 1134 with 170% thickness, and facet 1136 with 50% thickness. While in this example, the two coating directions are depicted as lying completely in the same plane, one coating direction could also be out of the plane of the other direction. (For example, a first coating direction might be normal to the glass surface, while a second coating direction might have a component parallel to the surface). When combined with 3-dimensional texturing, such variations can create even more complex coloring, providing further design options and greater aesthetic appeal.

Embodiments of the present invention provide PV roof tiles with a micro-textured or frosted glass cover, which can display a uniform color with little light absorption and less sparkle, flop, and graininess than conventional colored glass. Customizable directional and multi-directional coating, can provide further aesthetic options, including intentionally angle-dependent color, while still performing efficiently for solar conversion. Finally, the disclosed system and methods can also provide a layer of sphere-shaped metal nanoparticles on the inside surface of the glass cover. These nanoparticles can produce colors efficiently while absorbing little light.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A photovoltaic roof tile, comprising:
 a front glass cover having a front surface and a back surface, wherein the back surface is textured, and wherein the textured back surface comprises at least a first set of facets facing a first direction and a second set of facets facing a second direction;
 a back cover facing the back surface of the front cover;
 a plurality of photovoltaic structures positioned between the front glass cover and the back cover; and
 a directional color filter positioned between the back surface of the front glass cover and the plurality of photovoltaic structures, wherein the directional color filter is configured to directionally reflect light of a first color, wherein the directional color filter is deposited directly on the first and second sets of facets, and wherein a thickness of the directional color filter on the first set of facets is larger than a thickness of the directional color filter on the second set of facets.

2. The photovoltaic roof tile of claim 1, wherein the textured back surface comprises an array of features, and wherein the array of features includes at least one of:
   an array of grooves;
   an array of cones;
   an array of triangular pyramids;
   an array of square pyramids; and
   an array of hexagonal pyramids.

3. The photovoltaic roof tile of claim 1, wherein the directional color filter comprises a layer of transparent conductive oxide.

4. The photovoltaic roof tile of claim 1, wherein the directional color filter comprises a layer of silicon dioxide.

5. The photovoltaic roof tile of claim 1, wherein a respective facet in the first or second set of the facets is further textured using a chemical etching technique.

6. The photovoltaic roof tile of claim 1, wherein a respective facet in the first or second set of the facets is further textured by blasting nanoparticles on the facet.

7. A photovoltaic roof tile, comprising:
   a front glass cover having a front surface and a back surface, wherein the back surface is textured, wherein the textured back surface comprises at least a first set of facets facing a first direction and a second set of facets facing a second direction, and wherein a respective facet is further textured using a layer of sphere shaped metal nanoparticles;
   a back cover facing the back surface of the front cover; and
   a plurality of photovoltaic structures positioned between the front glass cover and the back cover; and
   a directional color filter positioned between the back surface of the front glass cover and the plurality of photovoltaic structures, wherein the directional color filter is configured to directionally reflect light of a first color, wherein the directional color filter is deposited directly on the first and second sets of facets, and wherein a thickness of the directional color filter on the first set of facets is larger than a thickness of the directional color filter on the second set of facets.

8. The photovoltaic roof tile of claim 7:
   wherein the layer of sphere shaped metal nanoparticles comprises an outer layer of antimony and an inner layer of metal; and
   wherein the layer of sphere shaped metal nanoparticles is annealed on the glass cover.

9. The photovoltaic roof tile of claim 7, wherein the layer of sphere shaped metal nanoparticles is preferentially grown, dip-coated, or spin-coated on the back surface of the front glass cover.

10. The photovoltaic roof tile of claim 7, wherein the metal nanoparticles comprise silver.

11. The photovoltaic roof tile of claim 7, wherein the metal nanoparticles comprise gold.

12. The photovoltaic roof tile of claim 7, wherein the metal nanoparticles comprise aluminum.

13. A directionally colored photovoltaic roof tile, comprising:
   a front glass cover having a front surface and a textured back surface, wherein the textured back surface comprises at least a first set of facets facing a first direction and a second set of facets facing a second direction;
   a back cover;
   a plurality of photovoltaic structures positioned between the front glass cover and the back cover; and
   a coating layer directly covering at least the first and second sets of facets, wherein a thickness of the coating layer on the first set of facets is larger than a thickness of the coating layer on the second set of facets;
   wherein the coating layer is a directional color filter, wherein the directional color filter is configured to directionally reflect light of a first color.

14. The directionally colored photovoltaic roof tile of claim 13, wherein the coating layer comprises a transparent film configured to reflect a predetermined color based on interference.

15. The directionally colored photovoltaic roof tile of claim 13, wherein the coating layer is configured to provide color for viewers at particular viewing angles, while enhancing optical transparency at other angles.

16. The directionally colored photovoltaic roof tile of claim 15, wherein the particular viewing angles comprise glancing angles below 20°.

17. The directionally colored photovoltaic roof tile of claim 13, wherein the coating layer is configured to create a variation in color across the front glass cover of the photovoltaic roof tile.

* * * * *